US011742800B2

(12) United States Patent
Hashimoto (10) Patent No.: US 11,742,800 B2
(45) Date of Patent: Aug. 29, 2023

(54) TERAHERTZ GUNN OSCILLATOR USING GALLIUM NITRIDE

(71) Applicant: SixPoint Materials, Inc., Buellton, CA (US)

(72) Inventor: Tadao Hashimoto, Santa Barbara, CA (US)

(73) Assignee: SixPoint Materials, Inc., Buellton, CA (US)

( * ) Notice: Subject to any disclaimer, the term of this patent is extended or adjusted under 35 U.S.C. 154(b) by 0 days.

(21) Appl. No.: 17/990,530

(22) Filed: Nov. 18, 2022

(65) Prior Publication Data

US 2023/0163724 A1 May 25, 2023

Related U.S. Application Data

(60) Provisional application No. 63/281,611, filed on Nov. 19, 2021.

(51) Int. Cl.
| H03B 9/12 | (2006.01) |
| H10N 80/00 | (2023.01) |
| H10N 80/10 | (2023.01) |

(52) U.S. Cl.
CPC .............. *H03B 9/12* (2013.01); *H10N 80/01* (2023.02); *H10N 80/107* (2023.02); *H03B 2009/123* (2013.01)

(58) Field of Classification Search
CPC .... H03B 9/12; H03B 2009/123; H10N 80/10; H10N 80/103; H10N 80/107

(Continued)

(56) References Cited

U.S. PATENT DOCUMENTS

| 5,432,482 A * | 7/1995 | Bailey ................. H03B 9/147 |
| | | 331/172 |
| 6,344,658 B1 * | 2/2002 | Nakagawa ............. H03B 9/14 |
| | | 257/497 |

(Continued)

FOREIGN PATENT DOCUMENTS

CN 107017310 B 1/2020

OTHER PUBLICATIONS

Hajo, A., et al., "Reliable GaN-Based THz Gunn Diodes With Side-Contact and Field-Plate Technologies", IEEE Access, vol. 8, 2020, pp. 84116-84122, Digital Object Identifier 10.1109/ACCESS.2020.2991309, Apr. 29, 2020.

(Continued)

*Primary Examiner* — Levi Gannon
(74) *Attorney, Agent, or Firm* — STRATEGIC INNOVATION IP LAW OFFICES, P.C.

(57) ABSTRACT

The present invention provides a terahertz oscillator utilizing a GaN Gunn diode. A terahertz wave is generated in the active layer of the Gunn diode fabricated on GaN substrate. A GaN substrate is designed to act as a waveguide of the terahertz wave. Since the waveguide and the Gunn diodes are integrated, the terahertz wave generated in the active layer couples well with the waveguide made of the GaN substrates. The terahertz wave is emitted from the edge of the waveguide efficiently. To ensure high-reliability through reduction of radiation loss and mitigation of electromigration of anode metal, a GaN substrate with low dislocation density is used. The dislocation density of the GaN substrate is less than $1\times10^6$ $cm^{-2}$. Particularly, usage of a GaN substrate made by the ammonothermal method is preferred.

19 Claims, 8 Drawing Sheets

(58) Field of Classification Search
USPC .................................................... 331/107 G
See application file for complete search history.

(56) References Cited

U.S. PATENT DOCUMENTS

| | | | | |
|---|---|---|---|---|
| 2006/0232347 | A1* | 10/2006 | Newsome | H10N 80/107 |
| | | | | 257/E47.004 |
| 2010/0163837 | A1* | 7/2010 | Yilmazoglu | H10N 80/107 |
| | | | | 250/370.12 |
| 2021/0328143 | A1* | 10/2021 | Yilmazoglu | H10N 80/107 |
| 2022/0221583 | A1* | 7/2022 | Rolland | H04B 10/40 |

OTHER PUBLICATIONS

Strelchuk, V.V., et al., "Spatial Distribution of Free Carrier Concentration in Vertical GaN Gunn-diode Structures Studied by Confocal Micro-Raman Spectroscopy and Kelvin Probe Force Microscopy", Physica Status Solidi C, vol. 11, No. 2, pp. 269-273, DOI:10.1002/pssc.201300294, Jan. 16, 2014.

Terahertz Technology, Xander Phillips, First Edition 2011, ISBN: 978-93-81157-35-0, Published by the English Press, pp. 1-12.

PCT/US2022/050445 International Search Report and Written Opinion dated Mar. 20, 2023, pp. 14.

Yilmazoglu, O., et al., "Measured Negative Differential Resistivity for GaN Gunn Diodes on GaN Substrate", Electronics Letters, vol. 43, No. 8, pp. 480-481, XP006028496, DOI: 10.1049/EI:20070658, Apr. 12, 2007.

Alekseev, E., et al., "Development of GaN-based Gunn-Effect Millimeter-Wave Sources", 24th Workshop on Compound Semiconductor Devices and Integrated Circuits, Aegean Sea, Greece, 2000, XP093025774, pp. 1-2.

Dalle, C., "Electromagnetic Physical Numerical Modeling of a GaN Distributed Transferred Electron Device-Based Planar Waveguide THz Oscillator", IEEE Transactions on Magnetics, vol. 56, No. 2, pp. 1-4, XP011766663, DOI: 10.1109/TMAG.2019.2952634, Feb. 2020.

Liu, Y., et al., "X-ray Topography Characterization of GaN Substrates Used for Power Electronic Devices", Journal of Electronic Materials, vol. 50, No. 6, pp. 2981-2989, https:/doi.org/10.1007/s11664-021-08762-6, 2021.

* cited by examiner

TERAHERTZ GUNN OSCILLATOR USING GALLIUM NITRIDE

CROSS REFERENCE TO RELATED APPLICATIONS

This patent application claims the benefit of priority to U.S. Provisional Patent Application 63/281,611 filed Nov. 19, 2021 with title "Terahertz Gunn Oscillator Using Gallium Nitride" and inventor Tadao Hashimoto. This application is also related to PCT patent application number PCT/US2022/050445 filed previously to this patent application on even date herewith.

These applications and all other references listed herein are incorporated by reference in their entirety as if put forth in full below.

BACKGROUND

Field of the Invention

The invention relates to a semiconductor device primarily used for generating terahertz waves. More specifically, the invention relates to Gunn diodes made of gallium nitride (GaN).

Other Background Information

This document refers to several publications and patents as indicated with numbers within brackets, e.g., [x]. Following is a list of these publications and patents
[1] A. S. Hajo, O. Yilmazoglu, A. Dadgar, F. Kuppers, and T. Kusserow, IEEE Access volume 8 (2020) 84116/
[2] Y. Liu, H. Peng, T. Ailihumaer, B. Raghothamachar, and M. Dudley, Journal of electronic materials 50 (2021) 2981.

An electromagnetic wave with a frequency between 0.3 THz (or 300 GHz) and 10 THz is called a terahertz wave. Recently, people started to research the applications of terahertz waves in the frequency range from 0.3 to 3 THz. People recognize a variety of applications, including security cameras, non-destructive inspections, and medical diagnosis. However, due to a lack of a high-power oscillator of terahertz waves, the progress in terahertz technologies has been significantly impeded.

A several attempts were made to make a high-power terahertz oscillator. Vacuum tubes can generate high-power terahertz waves; however, it is difficult to make a compact source. Methods using external lasers for pulsed or continuous wave (CW) photomixing require substantial laser power. If a gas laser is used, the system becomes large, and if a semiconductor laser is used, the system cannot generate the needed high-power. At this moment, there is no solid-state terahertz generator that can emit watt-class terahertz waves.

Gunn diodes are widely used in microwave oscillators. Conventional Gunn diodes are made of gallium arsenide (GaAs) and used in X-band (8-12 GHz). Although GaAs Gunn diodes can extend their frequency range to about 200 GHz, it is impossible to cover the terahertz range.

Gallium nitride (GaN) is a wide-bandgap semiconductor having a direct transition band structure, similar to GaAs. Owing to its large electron saturation velocity, it was pointed out that Gunn diodes made of GaN can emit terahertz wave higher than 0.7 THz (Ref. [1]).

However, there are issues of the radiation efficiency and the reliability of GaN Gunn diodes. Due to large energy separation between the lowest valley and the second lowest valley in the conduction band, the threshold voltage to achieve Gunn oscillation in a GaN Gunn diode is much higher than the oscillation threshold in GaAs Gunn diodes. In addition, due to the large density of state in the lowest valley, a greater number of electrons must be injected to induce the Gunn effect in a device formed of GaN.

Because of these two factors, current GaN Gunn diodes require much higher power input to induce the Gunn effect than Gunn diodes formed with other materials. Higher power input causes overheating of the device as well as electromigration of anode metal. These two factors deteriorate the reliability and shorten the lifetime of the device.

SUMMARY OF THE INVENTION

The present invention provides a terahertz oscillator utilizing a GaN Gunn diode. A terahertz wave is generated in the active layer of the Gunn diode fabricated on GaN substrate. A GaN substrate (preferably single-crystal GaN) is designed to act as a waveguide of the terahertz wave. Since the waveguide and the Gunn diode are formed in a single chip having dimensions that enable the GaN substrate to function as a waveguide and thereby forming an integrated structure, the terahertz wave generated in the active layer couples well with the waveguide made of the GaN substrate. The terahertz wave is emitted from the edge of the waveguide efficiently.

To ensure high-reliability through the reduction of radiation loss and mitigation of electromigration of anode metal, a GaN substrate with low dislocation density is used. The dislocation density of the GaN substrate is less than $1\times10^6$ $cm^{-2}$. Particularly, a GaN substrate made by the ammonothermal method is preferred because the resultant GaN does not have a grain structure which is commonly observed in GaN substrates made by hydride vapor phase epitaxy (HVPE) (Ref. [2]). The typical grain size in HVPE-made GaN substrates is a few hundred microns, which is comparable to the wavelength of terahertz wave. Therefore, grain boundaries scatter terahertz wave and cause radiation loss in the waveguide. In addition, if a GaN substrate has a grain structure, many dislocations exist at the grain boundaries. These dislocations promote electromigration of anode metal.

In one embodiment, a GaN substrate has an n-type conduction and an anode contact is formed on the GaN substrate, and a Gunn diode is formed on the other side to the anode contact. The GaN substrate forms a slab waveguide, with the GaN substrate having longitudinal dimension of L, lateral dimension of W, and thickness of T. As explained in more detail below, the integrated Gunn diode oscillator chip depicted in FIG. 1 and FIG. 4-6 also has dimensions of L and W, although this is not necessarily the case in all instances. The GaN layers forming the Gunn diode may have dimensions of L and W, or these layers may have e.g., length less that L and/or width less than W if desired. The Gunn diode emits the terahertz wave into the waveguide. The waveguide is shaped to conduct the terahertz wave along the longitudinal direction, and emits the terahertz wave at the termination edges of the waveguide as explained in more detail below.

In one embodiment, the Gunn diode comprises an active layer of an n-type GaN having an electron saturation velocity of Vsat. The thickness t of the active layer is calculated from the equation $t=\lambda Vsat/c$, wherein c is the speed of light ($2.998\times10^{10}$ cm/s) and $\lambda$ is the wavelength of the radiation in air.

In one embodiment, the Gunn diode further comprises a contact layer of $n^+$-GaN on the top of the active layer, a passivation layer with a contact hole in the contact layer, and a metal cathode contact in the contact hole, wherein the surface area of the contact hole is smaller than 0.01 mm$^2$, more preferably smaller than 0.005 mm$^2$, or more preferably smaller than 0.001 mm$^2$ to restrict the total current injected to the device.

In one embodiment, the longitudinal dimension L of the GaN substrate is a multiple of $\lambda/2n$, wherein n is the refractive index of the GaN substrate at $\lambda$.

In one embodiment, the metal cathode contact in the contact hole is mounted on a conductive base with a metal bond, and the thickness of the GaN substrate is selected so that the GaN substrate act as a vertical antenna. In this configuration, the conductive base acts as a ground of the antenna.

In one embodiment, the thickness of the GaN substrate T is selected to be $5/4\lambda/n$ or $9/4\lambda/n$ so that the GaN substrate acts as a vertical antenna efficiently.

In one embodiment, the lateral dimension W of the waveguide is selected to provide a single mode transmission of the terahertz wave.

In one embodiment, the contact hole is located at L/2 from the termination edge and W/2 from the lateral boundary of the waveguide. In other words, the contact hole and its corresponding metal cathode contact area are located at the center of the chip.

In one embodiment, the conductive base further comprises a wave reflector on one side of the termination edge of the GaN substrate. With the wave reflector, the terahertz wave is selectively emitted from the opposite termination edge.

In one embodiment, the wave reflector comprises a plurality of walls (preferably metal) defining one or more gaps having a gap width of $\lambda/4$.

In one embodiment, the GaN substrate has grooves on the same side of the anode contact forming a Bragg-reflector at one termination edge of the waveguide.

In one embodiment, the anode contact has a periodic pattern perpendicular to the longitudinal dimension with a periodicity of $\lambda/2n$.

In one embodiment, the GaN substrate has dislocation density less than $10^6$ cm$^{-2}$ to maximize the efficiency and the reliability through reducing the disturbance of the terahertz wave in the waveguide and mitigating electromigration of anode metal.

In one embodiment, a GaN substrate without a grain structure is used to maximize the efficiency and the reliability through reducing the disturbance of the terahertz wave in the waveguide and mitigating electromigration of anode metal.

In one embodiment, a GaN substrate made by ammonothermal growth is used to maximize the efficiency and the reliability through reducing the disturbance of the terahertz wave in the waveguide and mitigating electromigration of anode metal.

In one embodiment, the lateral direction of the waveguide is along the a-direction of the GaN substrate. This means that the longitudinal direction of the waveguide is along the m-direction.

In one embodiment, the cathode of the Gunn diode has the same length and width of the second major side of the GaN substrate as discussed later, such that the cathode has essentially the same surface area as the GaN substrate's second major side.

In any embodiment above, the terahertz oscillator may have dimensions and materials selected to emit terahertz waves having a radiant energy of at least 0.1 Watt. Preferably, the radiant energy is at least 0.2, 0.5, or 1 Watts. The terahertz oscillator has dimensions based on the GaN substrate waveguide selected to emit terahertz waves, and the radiant energy is provided by e.g. inverting the Gunn oscillator so that the cathode is grounded and can also provide effective heat exchange as illustrated by various configurations discussed below.

Further, in any embodiment above, the terahertz oscillator may have dimensions of the GaN substrate waveguide selected to emit terahertz waves having a frequency of at least 250, 300, 350, 750, 800, or 850 GHz, for instance.

In addition, in any embodiment above, the anode and/or preferably the cathode of the Gunn diode may each separately or together have exposed surfaces that are planar across their entire surfaces as explained below.

Any of the embodiments mentioned above or elsewhere herein may be combined with any one or more other embodiments.

BRIEF DESCRIPTION OF THE DRAWINGS

Referring now to the drawings in which like reference numbers represent corresponding parts throughout:

In the figures each number represents the following:
11. GaN substrate
12. anode contact
13. n-GaN active layer
14. n$^+$-GaN contact layer
15. passivation layer
16. metal cathode contact
17. metal bond
18. conductive base
19. lead wire
20. anode terminal
21. insulator
22. support
FIG. 2B is a cross-sectional view of the terahertz oscillator of FIG. 2A. The cross section is at the termination edge. Each number represents the following:
11. GaN substrate
11A. lateral boundary of waveguide
11B. lateral boundary of waveguide
12. anode contact
13. n-GaN active layer
14. n$^+$-GaN contact layer
15. passivation layer
16. metal cathode contact
17. metal bond
18. conductive base
FIG. 4 is a side view of one example of a terahertz oscillator. Each number represents the following:
11. GaN substrate
11C. second termination edge
11D. first termination edge
12. anode contact
13. n-GaN active layer
14. n⁺-GaN contact layer
15. passivation layer
16. metal cathode contact
17. metal bond
18. conductive base
18A. plates forming a wave reflector
18B. gaps (filled with e.g. air or inert gas)
19. lead wire
20. anode terminal extending through support 22
22. support
23. cathode terminal
FIG. 5 is a side view of one example of a terahertz oscillator. Each number represents the following:
11. GaN substrate
11C. second termination edge
11D. first termination edge
11E. grooves
11F. GaN substrate portions forming a wave reflector
12. anode contact
13. n-GaN active layer
14. n⁺-GaN contact layer
15. passivation layer
16. metal cathode contact
17. metal bond
18. conductive base
19. lead wire
20. anode terminal extending through support 22
22. support
23. cathode terminal
FIG. 6 is a bird-eye view of one example of a terahertz oscillator. In the figures each number represents the following:
11. GaN substrate
12A. anode contact with a periodic pattern
12A1, 12A2, and 12A3 are each windows in anode contact 12A exposing the underlying GaN substrate
13. n-GaN active layer
14. n⁺-GaN contact layer
15. passivation layer
16. metal cathode contact
17. metal bond
18. conductive base
19. lead wire
20. anode terminal
21. insulator
22. support

DETAILED DESCRIPTION OF THE INVENTION

Figure 1:
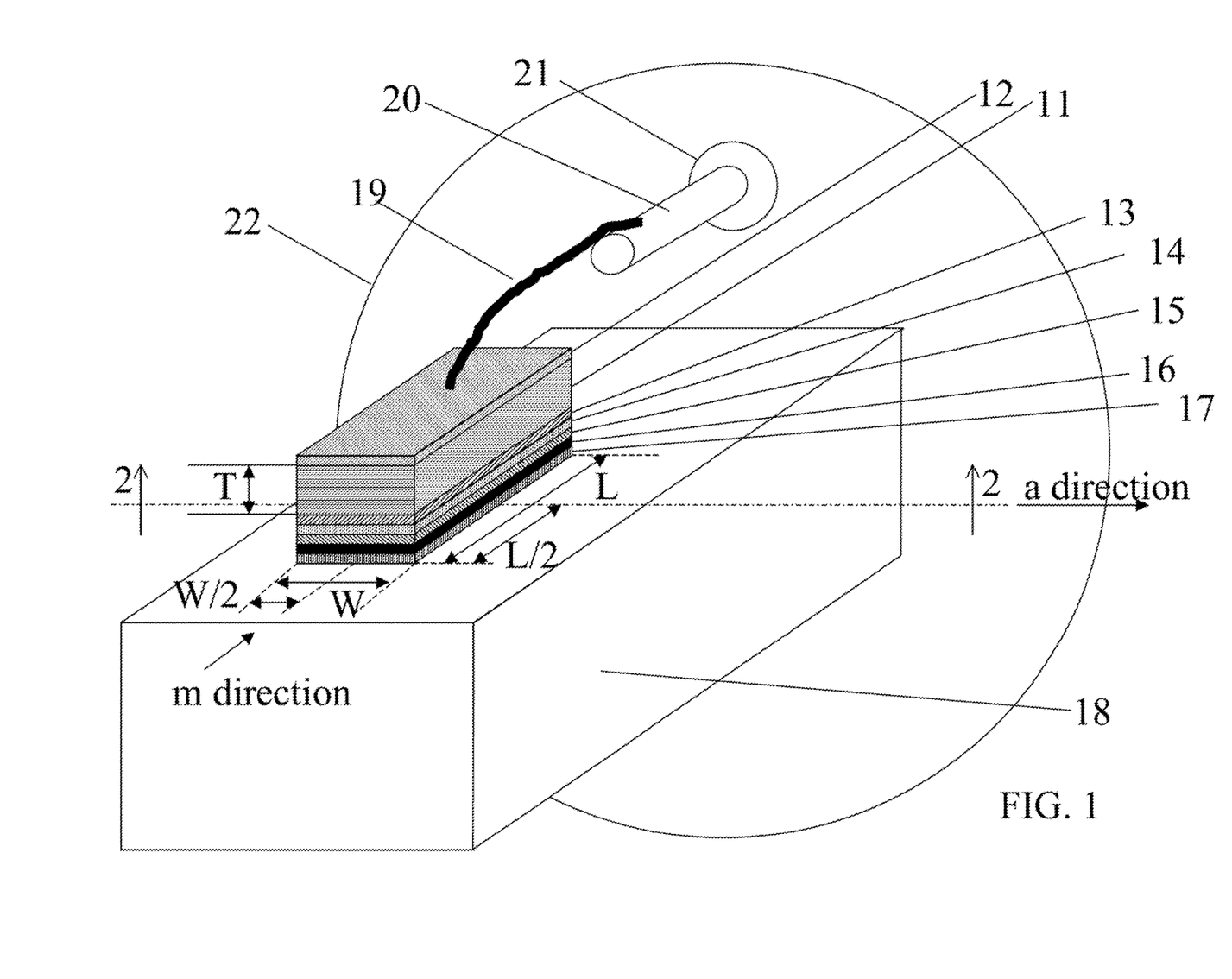
FIG. 1 is a bird-eye view of one example of a terahertz oscillator comprised of a Gunn diode secured to a conductive base.
Figure 2A:
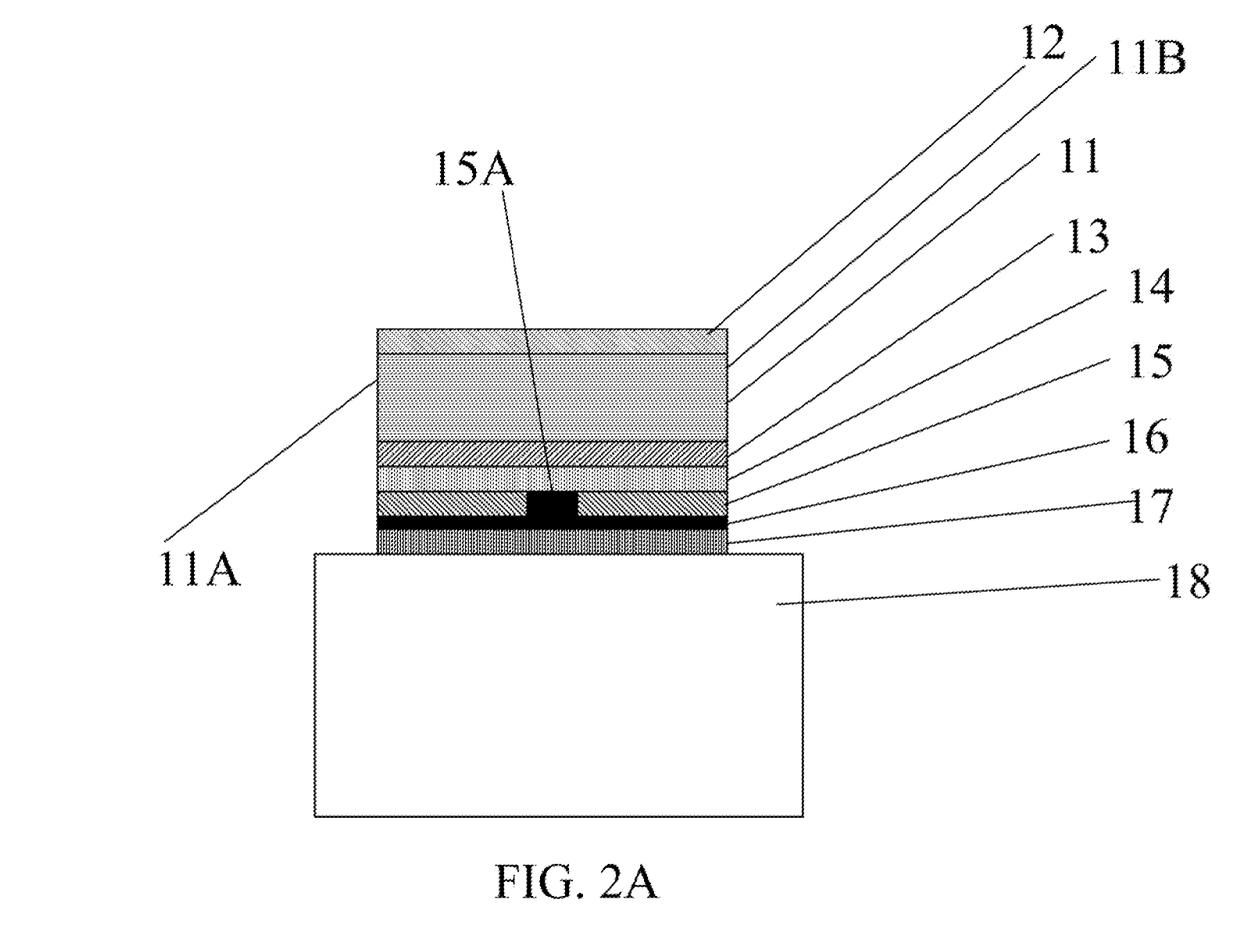
FIG. 2A is a cross-sectional view of one example of a terahertz oscillator. The cross section is at the center position along the longitudinal direction. Each number represents the following:
11. GaN substrate
11A. lateral boundary of waveguide
11B. lateral boundary of waveguide
12. anode contact
13. n-GaN active layer
14. n$^+$-GaN contact layer
15. passivation layer
15A. contact hole
16. metal cathode contact
17. metal bond
18. conductive base
Figure 3A:
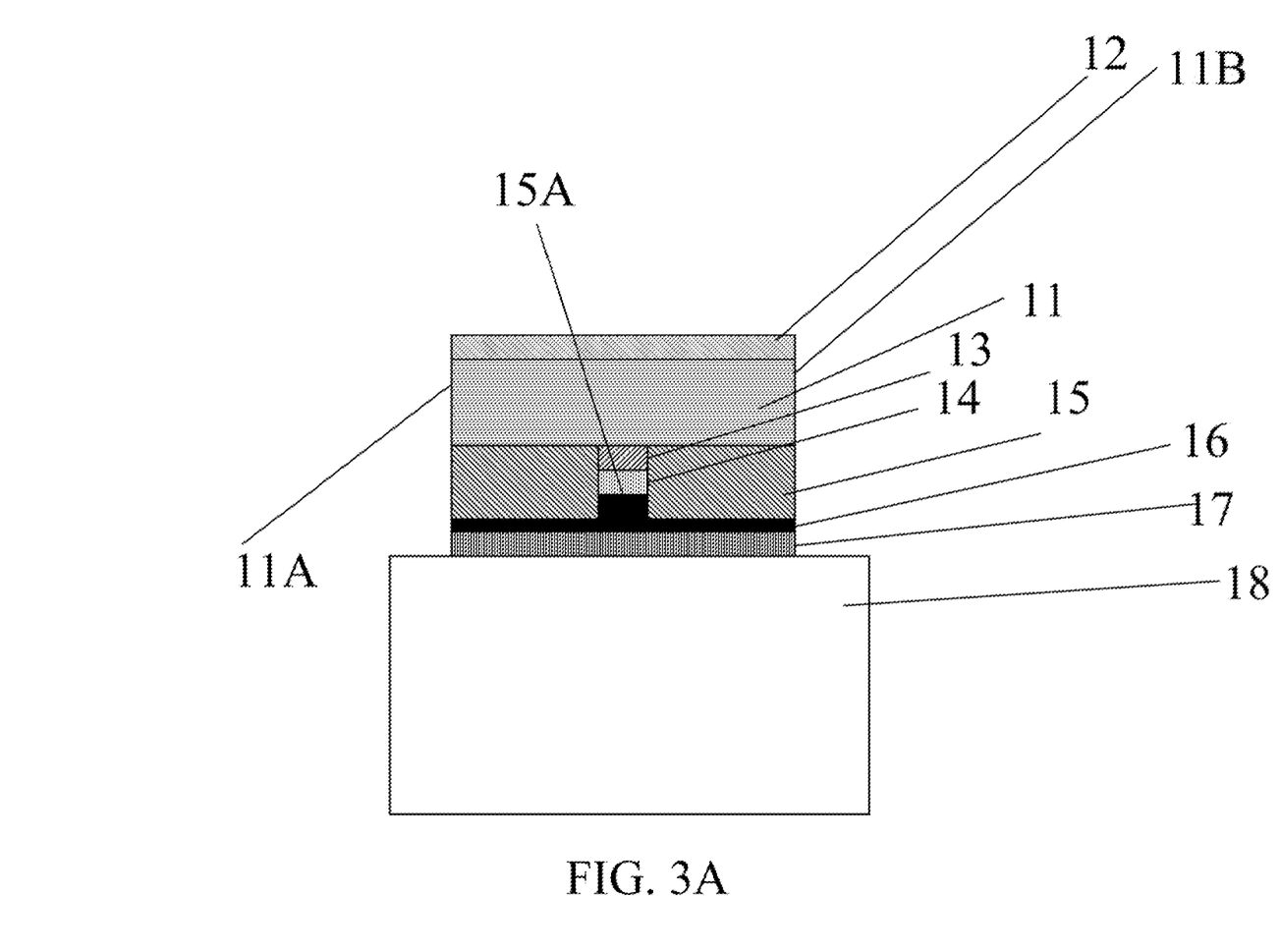
FIG. 3A is a cross-sectional view of one example of a terahertz oscillator with a mesa structure. The cross section is at the center position along the longitudinal direction. Each number represents the following:
11. GaN substrate
11A. lateral boundary of waveguide
11B. lateral boundary of waveguide
12. anode contact
13. n-GaN active layer
14. n⁺-GaN contact layer
15. passivation layer
15A. contact hole
16. metal cathode contact
17. metal bond
18. conductive base
Figure 3B:
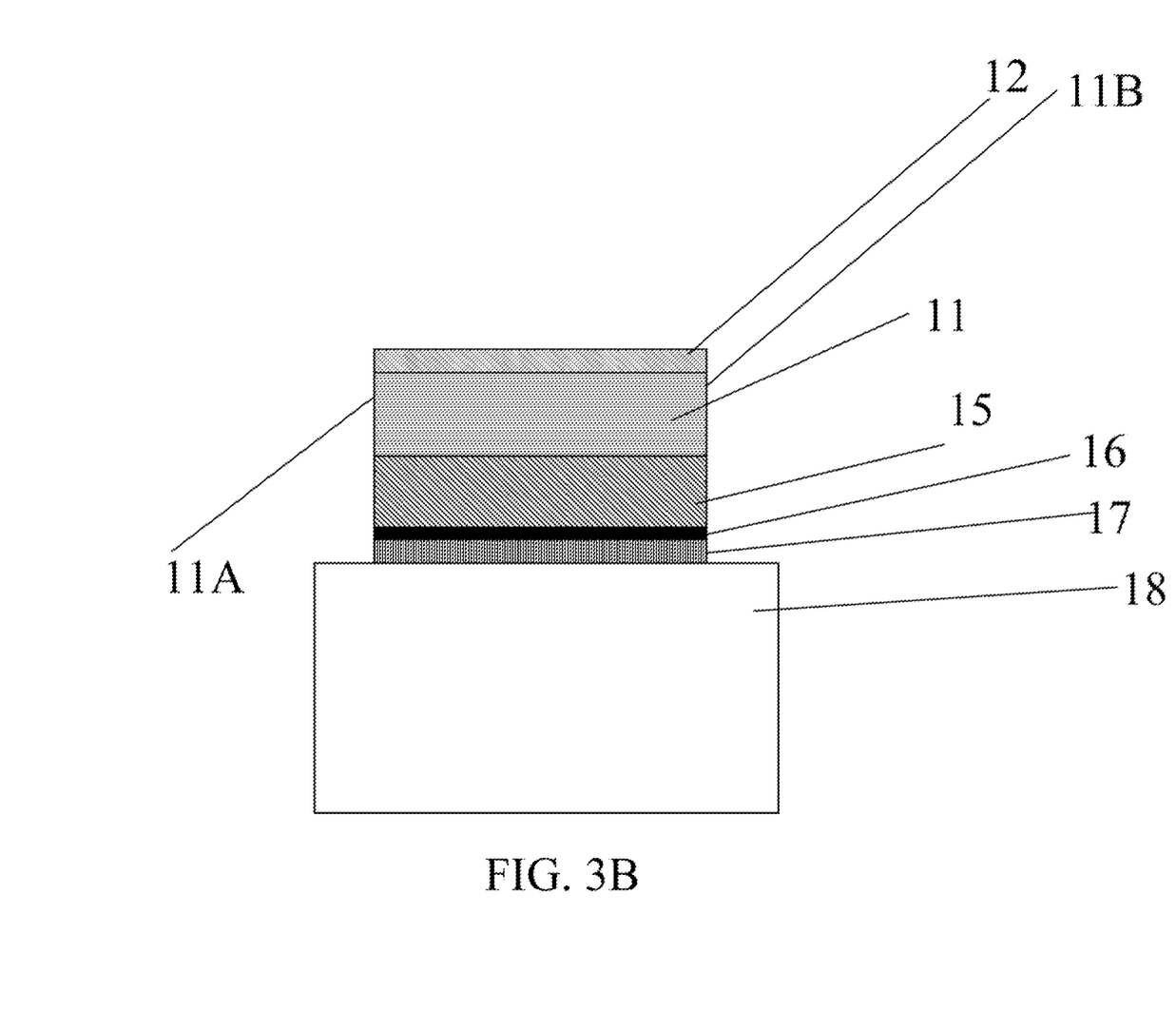
FIG. 3B is a cross-sectional view of the terahertz oscillator of FIG. 3A. The cross section is at the termination edge. Each number represents the following:
11. GaN substrate
11A. lateral boundary of waveguide
11B. lateral boundary of waveguide
12. anode contact
15. passivation layer
16. metal cathode contact
17. metal bond
18. conductive base

FIG. 1 is an example of the terahertz oscillator in this invention. The Gunn diode structure is fabricated on a GaN substrate 11 that has a dislocation density less than $1 \times 10^6$ cm$^{-2}$. The GaN substrate is single crystal GaN made by the ammonothermal method and is preferably free of a grain structure. In the figure, the Gunn diode chip, which includes features 11 through 16 in FIG. 1 is mounted up side down compared to traditional Gunn diode chips, with metal bond 17 to ground the cathode 16, to improve heat dissipation, and to allow the GaN substrate 11 to be configured as a waveguide in processing steps discussed in Example 1, for instance. Since the operation heat is primarily generated in the active layer 13, heat dissipation is improved by mounting the chip up-side-down. As explained below, to make the current-flowing region in the substrate 11 act as an antenna, the cathode 16 is grounded, in this instance through metal bond 17 secured to cathode 16's exposed surface which is preferably planar across the entire surface, conductive base 18, and optionally support 22 if another ground path is not provided. In addition, to improve the coupling of the antenna to the waveguide formed with the substrate 11, the chip is mounted up-side-down on the conductive substrate 18. On the GaN substrate 11, an anode contact 12 is formed. The upper exposed surface of the anode contact 12 is preferably planar across the entire electrode of the Gunn diode. In the device illustrated in FIG. 1, the anode contact 12 is electrically connected via lead wire 19 to anode terminal 20 on the anode contact's exposed surface, and the lead wire 19 is electrically isolated from support 22 by insulator 21, although any other configuration can be used to provide electrical current to the and remove heat from the Gunn diode chip. On the opposite side of the GaN substrate 11, an n-GaN active layer 13 and an n⁺-GaN contact layer 14 are formed. Optionally, an additional buffer layer (not shown) can be inserted between the substrate 11 and the active layer 13 to avoid accumulation of impurities at the interface between the substrate 11 and the active layer 13. On the contact layer 14, a passivation layer 15 with a contact hole 15A as illustrated in FIG. 2A is formed through a standard semiconductor fabrication process. Optionally, the active layer 13 and the contact layer 14 under the area outside of the contact hole 15A is turned insulating by ion implantation of nitrogen, magnesium, carbon, iron, or manganese for instance. In this way, current spread along the lateral direction is restricted, and the current flowing to the substrate 11 is confined in the cross-sectional area of the contact hole 15A. Alternatively, the current path is limited by forming a mesa structure by etching the active layer 13 and the contact layer 14 to the substrate 11 or the optional buffer layer 15 (FIGS. 3A and 3B). The mesa in this case is positioned within contact hole 15A, which can have a circular, square, rectangular, hexagonal, or other shape when viewed from above. The upper surface of the active layer 13 of the mesa may be coplanar with the passivation layer 15's upper surface as illustrated in FIGS. 3A and 3B. Alternatively, the active layer 13 may extend beyond the upper surface of the passivation layer 15 and therefore extend into a portion of the substrate 11, preferably no more than about one microns for a substrate 11 having a thickness of 100 or more microns. In the Gunn diode illustrated in FIGS. 3A and 3B, the passivation layer 15 covers the exposed substrate 11 or the optional buffer layer and sidewall of the mesa. The passivation layer 15 can be a typical insulating dielectric film such as silicon dioxide, silicon nitride, and aluminum oxide. To confine the terahertz wave in the waveguide formed from the GaN substrate, it is preferable to form the passivation layer of a material having a smaller refractive index than the refractive index of the GaN substrate. As is readily apparent from FIG. 1, the GaN substrate has n-type conduction and has a length L, a width W, and a thickness T and therefore has two major sides: a first major side along a face at the length and width of the substrate, a second major side on an opposite side of the substrate, a first termination edge at an end of the substrate and along the width and thickness of the substrate, a second termination edge at an opposite end of the substrate, a first lateral boundary at a side of the substrate and along the length and thickness of the substrate, and a second lateral boundary at an opposite side of the substrate. Each major side has essentially the same surface area. Each termination edge also has essentially the same surface area which differs from the surface area of a major side. Each lateral boundary also has the same surface area which differs from each of the surface areas of the major side and termination edge. Because the substrate can act as a waveguide, the dimensional terms discussed above for the substrate alone can also refer to analogous dimensional terms of the waveguide.

FIG. 2A is a cross-sectional view of the oscillator of FIG. 1 along the lateral direction at the center of the longitudinal direction. The metal cathode contact 16 connects the contact layer 14 and the metal bond 17 both thermally and electrically to conductive base 18 to provide both a cooling and an electrical pathway. The contact hole 15A in the passivation layer 15 has a cross-sectional area which limits the electric current so that excessive power is not applied to the device when the relatively high voltage required for device operation is applied across the cathode 16 and anode 12. The cross-section of the contact hole may be e.g., circular, square, triangular, or other shape. The cross-sectional area of the contact hole is preferably less than 0.01 mm$^2$, more preferably less than 0.001 mm$^2$, or more preferably less than 0.0001 mm$^2$ to avoid overheating of the device.

Figure 2B:
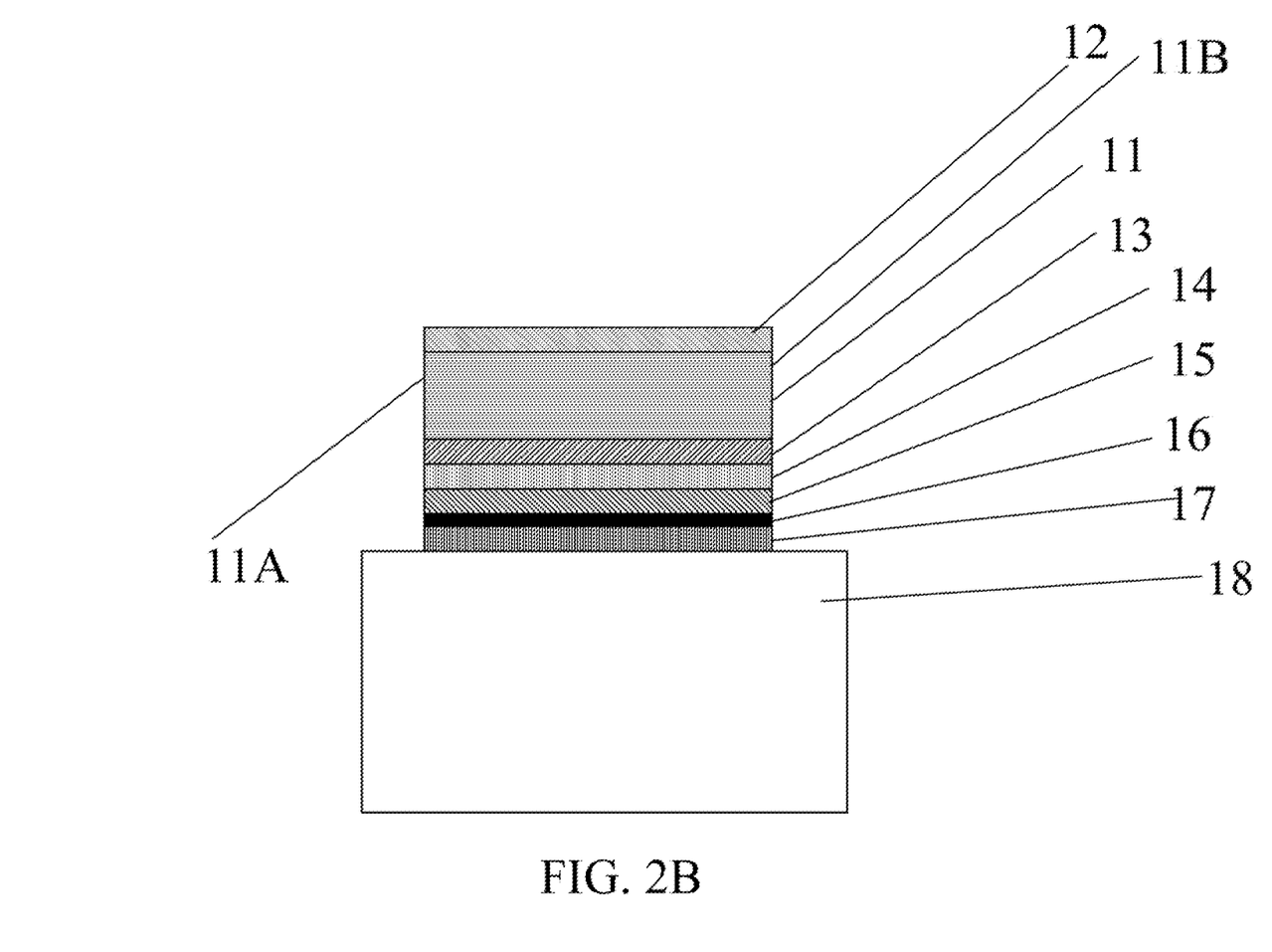

As noted previously, the Gunn diode chip is mounted up side down on a conductive base 18 using metal bond 17. The metal bond 17 preferably covers the entire Gunn diode chip area to ensure sufficient heat conduction from the active layer 13 to the conductive base 18. As shown in FIG. 1, FIG. 2A and FIG. 2B, the metal bond 17 preferably extends along the conductive substrate 18 beneath the entire area of the passivation layer 15 as well as the entire planar surface of the metal cathode contact 16, which was an exposed surface prior to its contact with metal bond 17. The anode contact 12 is electrically connected to the anode terminal 20 with lead wire 19. The anode terminal 20 is attached using a support 22, preferably comprised of heat-conductive and electrically conductive material such as metal, to the conductive base 18 but the anode terminal 20 is electrically insulated from the conductive base by at least insulator 21.

The thickness t of the active layer 14 is calculated using the electron saturation velocity Vsat of this n-GaN active layer, the desired wavelength λ of the terahertz wave in air and the speed of light c as provided previously by following the formula t=λVsat/c.

The shape of the Gunn diode chip is primarily determined by the shape of the GaN substrate 11 in which its L, W, and T are selected to enable the substrate to be a waveguide. As shown in FIG. 1, the GaN substrate 11 is a slab shape having longitudinal dimension of L, lateral dimension of W, and thickness T. Here these dimensions have a relationship of L>W>T. The dimensions are selected to achieve appropriate transmission of the terahertz wave along the longitudinal direction of the substrate and efficient radiation of the wave from the termination edge of the waveguide (11C and 11D in FIG. 4). There are two termination edges with the dimension of W×T The longitudinal dimension L of the substrate is preferably selected to be a multiple of λ/2n, so that the standing wave in the waveguide has a node of the standing wave at each termination edge. Since the longitudinal dimension L and the wavelength of the generated wave are of comparable order, only one standing wave is formed inside the waveguide. Therefore, the terahertz wave emitted from the termination edge is coherent like a laser. The dimension W is an important parameter to determine the lateral mode of the wave. In one instance, the dimension W is selected to allow only a single lateral mode transmission of the generated wave. Due to multiple layer structure of the slab, it is a common practice to determine W based on the results of a waveguide simulator.

The thickness T of the GaN substrate determines the coupling of the Gunn diode to the waveguide. The antenna theory teaches that the volume where the electric current flows in the GaN substrate acts as an antenna element. Since the cathode contact is grounded, efficient radiation occurs when the antenna element has a height of (¼+m)λ/n, where m is an integer and n is the refractive index of the GaN substrate 11. Considering the actual dimensions of the GaN substrate 11, it is preferable to adjust the thickness T to either 5λ/4n or 9λ/4n.

Since the fundamental mode of the wave has the maximum electric field at the center along the lateral direction, the contact hole of the cathode contact is preferably located at the center of the lateral dimension (W/2). Also, considering the location of the node of the standing wave in the waveguide, it is preferable to locate the contact hole of the cathode contact at the center of the longitudinal dimension (L/2).

Since GaN has a cleavage surface on m-plane, it is preferable to use m-plane for the termination edge where the radiation occurs. With smooth surface of the termination edge, scattering of the terahertz wave is minimized.

Figure 4:
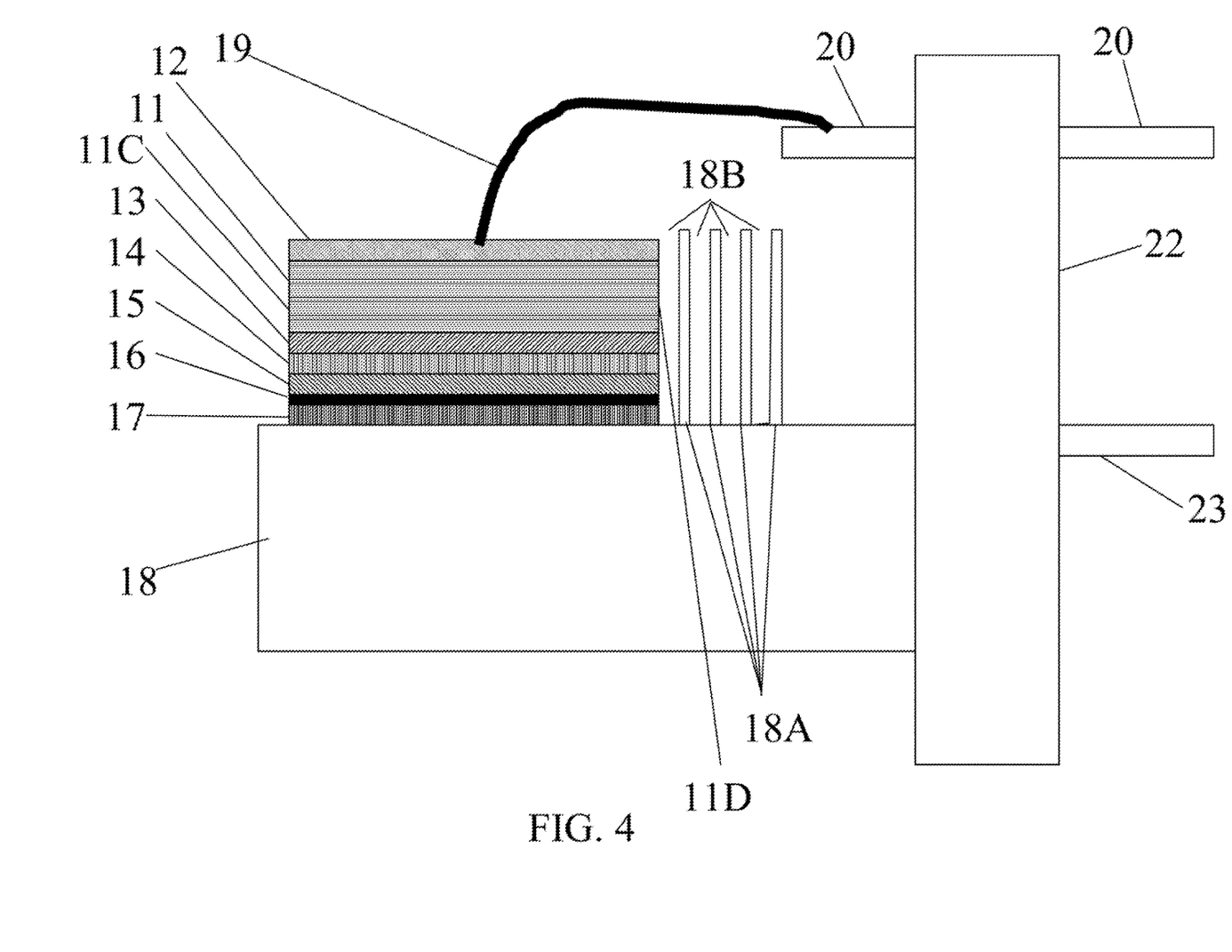

FIG. 4 illustrates how the oscillator can optionally have a wave reflector on one side of a termination edge such as first termination edge 11D so that the radiation selectively occurs on the second termination end 11C of the waveguide. One example of the wave reflector is one or more plates 18A (formed of e.g. metal) placed with one or more air gaps 18B of (¼+m)λ from a terminal edge of the GaN substrate, where m is an integer.

Figure 5:
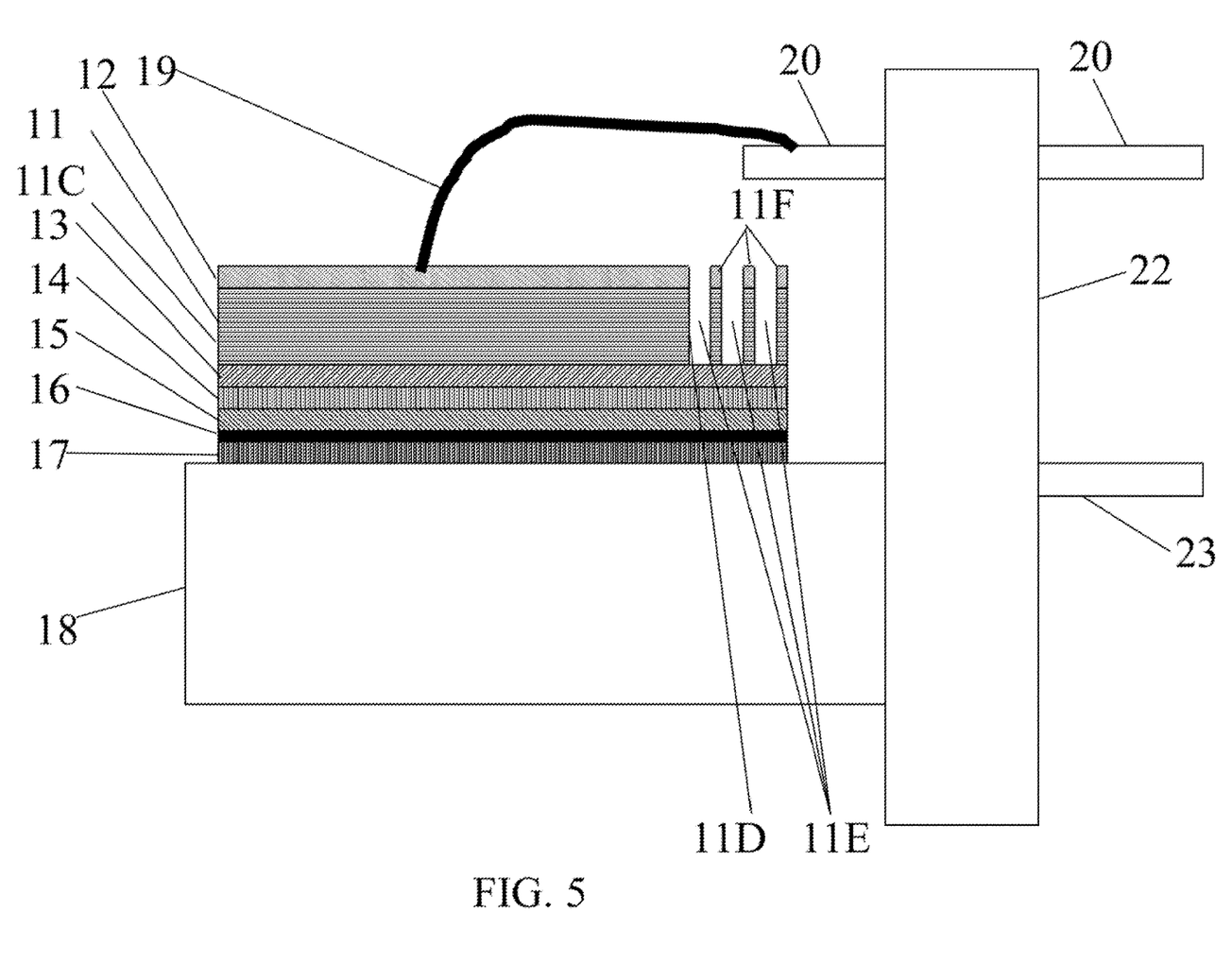

Another way is to provide air gaps in the GaN substrate 11 to form a Bragg-reflector composed of GaN substrate portions 11F comprised of portions of GaN substrate 11 and anode contact 12 as shown in FIG. 5. Grooves 11E having a gap width of (¼+m)λ can be formed by etching or dicing from the backside of the GaN substrate prior to chip dicing as used to form multiple chips from one wafer if the grooves are shallow, or after mounting the Gunn diode oscillator chip that was diced from a GaN wafer to the conductive base if the grooves are deep.

Figure 6:
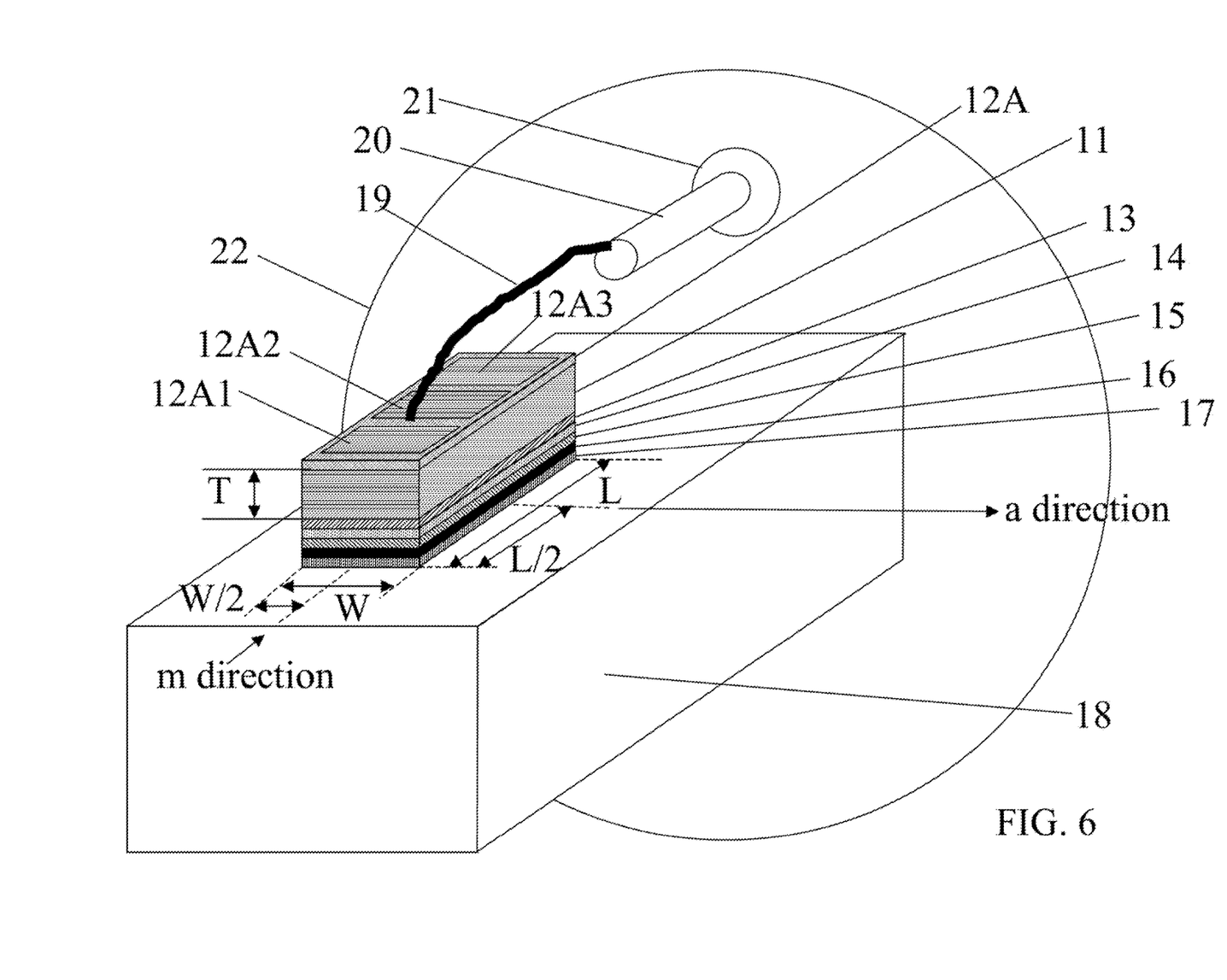

To fix the wavelength of the terahertz wave, the anode-contact can have a periodic pattern as shown in FIG. 6, where windows 12A1, 12A2, and 12A3 are e.g. etched into the anode material to expose portions of the underlying GaN substrate 11. The metal strips are aligned perpendicular to the longitudinal direction on the GaN substrate 11. Such metal strip pattern with appropriate design can modulate the electric field inside the waveguide and fix the wavelength of the standing wave.

Example 1

A 2" 400 micron-thick n-type GaN substrate grown by the ammonothermal method is prepared, as disclosed in e.g. U.S. Pat. No. 8,420,041B2. The GaN substrate contains oxygen as an n-type dopant. A GaN substrate grown by the ammonothermal method has about one order of magnitude lower dislocation density than that grown by hydride vapor phase epitaxy. The dislocation density of the prepared GaN substrate is about $2\times10^5$ cm$^{-2}$. Also, the GaN substrate is free of a grain structure. After hot acid etching in a mixture of sulfuric acid and hydrogen peroxide, followed by water rinse and solvent cleaning, the substrate is loaded into MOCVD reactor and a n-GaN buffer layer, n-GaN active layer, and n$^+$-GaN contact layer are grown. Each layer is doped with silicon during the MOCVD growth. The thickness and carrier concentration of these layers are 2 microns/$2\times10^{18}$ cm$^{-3}$, 0.5 microns/$2\times10^{17}$ cm$^{-3}$, and 0.2 microns/$2\times10^{18}$ cm$^{-3}$ for the buffer layer, active layer and the contact layer, respectively. The thickness of the active layer is determined by the desired frequency of 400 GHz, which has the wavelength of 0.075 cm in air. Using the electron saturation velocity Vsat of $2\times10^7$ cm/s and the speed of light c of $2.998\times10^{10}$ cm/s, the thickness t of the active layer is $\lambda$Vsat/c=0.075 (cm)$\times 2\times10^7$ (cm/s)/$2.998\times10^{10}$=$5\times10^{-5}$ cm=0.5 microns.

After growing GaN layers, the wafer is taken out of the MOCVD reactor and a passivation layer of silicon nitride is deposited by PECVD. A contact hole is made using a standard photolithography and dry etching. The contact hole has a circular shape with the diameter of 10 microns, or 0.01 mm. The surface area of the contact hole is $3.14\times0.005\times0.005$=0.0000785 mm$^2$. Then, a cathode contact is formed by evaporating Ti, Al, Ti, and Au in this order. The cathode contact covers the entire surface of the passivation layer and buries the contact hole to ensure electrical contact to the contact layer.

Then, ion implantation of magnesium is conducted with a conventional photoresist mask on the cathode contact to convert the conduction type of the n-GaN active layer, and n$^+$-GaN contact layer to insulating. In this way, the current flowing through the device is limited to the cross-sectional area of the cathode.

After removal of the photoresist, the GaN substrate with Gunn diode structure is mounted on a ceramic plate to grind the GaN substrate. Since the designed wavelength is 0.075 cm, or 750 microns, and the refractive index of GaN for the wavelength of 750 microns is about 3.22, the wavelength of the generated wave in GaN substrate is 750/3.22=233 microns. To make a 5$\lambda$/4 antenna element, the GaN substrate 11 is thinned to 291 microns by grinding, lapping and polishing. After thinning of the GaN substrate, an optional passivation layer comprised of Si$_x$N$_y$ and having thickness of 0.1 microns is formed, and the anode contact is formed by evaporating Ti, In, Ti, and Au. After the evaporation, the wafer is annealed at 400° C. The chip resulting from the steps above can be diced to L=1049 microns, which is 9$\lambda$/2n and W=400 microns, to provide multiple Gunn oscillator chips of appropriate dimensions. Each of these chips diced from the larger chip is individually mounted on a conductive base using e.g. Au/Sn bond. The cathode side is bonded to the conductive base so that cathode is grounded to the base. Gold wire, for example, is used to connect the anode contact metal to the anode electrode on the base. The oscillator emits a terahertz wave of about 0.4 THz (400 GHz).

Example 2

Using a similar fabrication process to that explained in Example 1, a terahertz oscillator having the active layer thickness of 0.16 micron is fabricated. The designed frequency of terahertz wave is 1.2 THz. The wavelength in air is 250 microns and the wavelength in the GaN substrate is 78 microns. The thickness of GaN substrate is set to 5$\lambda$/4=97.5 microns. The chip width W=400 microns. The longitudinal dimension L is 1053 microns, which is 27$\lambda$/2n.

Example 3

The Gunn diode chip explained in Example 1 is mounted on a conductive base having a periodic metal/air structure 18A/18B behind the chip as shown in FIG. 4. The gaps between the metal plates are 5$\lambda$/4, which is 291 microns. The metal structure is either machined or constructed through additive manufacturing (i.e., 3D printer). The chip is mounted accurately so that the terminal edge is parallel to the reflector metal structure. With this design, a terahertz wave is selectively emitted from another edge of the chip. Also, similar to Yagi-Uda antenna, the conductive base can have director elements. If the Gunn diode chip is configured to generate higher frequencies like the chip in Example 2, the gaps between plates can be larger so that machining of the metal can be done with a conventional machining tool.

Example 4

Instead of having the anode metal on the entire surface of the GaN substrate in Example 1, the anode contact metal 12A is partially patterned in stripe shape with periodicity of $\lambda$/2n, which is 116.5 microns as shown in FIG. 6. The patterning can be fabricated using conventional photolithography and etch to create windows 12A1, 12A2, and 12A3 and expose the underlying GaN substrate. The windows can be created by e.g. spin-coating a GaN wafer from which multiple chips will be formed with photoresist, patterning the photoresist, depositing metal contact layer material, and then removing the photoresist to create the windows. Alternatively, the windows may be created by e.g. depositing metal contact layer material over the GaN wafer from which multiple chips will be formed, depositing photoresist and patterning, then etching the metal contact layer material to provide metal contact layer 12A and windows 12A1, 12A2, and 12A3 as depicted in FIG. 6. The etch may expose GaN substrate 11 or may leave a thin layer of metal contact layer material in the bottom of windows 12A1, 12A2, and 12A3. The chip with the periodic stripe pattern helps pin the node position of the standing wave in the waveguide so that the wavelength and frequency of the terahertz wave from the oscillator become stable.

In view of the description herein, the following are nonlimiting examples of the invention as are the claims below:
1. A Gunn diode comprising
   a. a GaN substrate
      i. having n-type conduction and
      ii. having a first major side, a second major side on an opposite side of the substrate, a first termination edge at an end of the substrate, a second termination edge at an opposite end of the substrate, a first lateral boundary at a side of the substrate, and a second lateral boundary at an opposite side of the substrate, and
      iii. having a refractive index n at the emission wavelength, $\lambda$,
   b. an anode contact on the first major side of the GaN substrate,
   c. a n-GaN active layer residing on the second major side of the substrate, and
   d. a cathode so that the Gunn diode is configured to emit the terahertz wave formed on the second major side of the GaN substrate, wherein: a length, a width, a thickness, and the refractive index of the GaN substrate define a slab waveguide for the terahertz wave such that the Gunn diode emits the terahertz wave from a first termination edge of the slab waveguide during operation, the first termination edge of the slab waveguide corresponding to a plane of the first termination edge of the substrate and a second termination edge of the slab waveguide corresponding to a plane of the second termination edge of the substrate.
2. A Gunn diode according to paragraph 1, wherein the n-GaN active layer has an electron saturation velocity of Vsat, and the thickness t of the active layer is provided by the equation $t=\lambda Vsat/c$, wherein c is the speed of light.
3. A Gunn diode according to paragraph 1 or paragraph 2, wherein the Gunn diode further comprises a contact layer of $n^+$-GaN on a top of the n-GaN active layer, a passivation layer with a contact hole in the contact layer, and a portion of the metal cathode contact in electrical contact with the n-GaN active layer through the contact hole, wherein the cross-sectional area of the contact hole is less than 0.01 mm$^2$.
4. A Gunn diode according to paragraph 3, wherein the n-GaN active layer and the contact layer are electrically insulating due to ions implanted within the active layer and the contact layer.
5. A Gunn diode according to paragraph 4, wherein the ions comprise at least one member selected from the set comprised of nitrogen, magnesium, carbon, iron, and manganese ions.
6. A Gunn diode according to any one of paragraphs 3-5, wherein the n-GaN active layer and the n+-GaN contact layer additionally form a mesa extending through the passivation layer from the GaN substrate to a portion of the metal cathode contact that is in electrical contact with the n$^+$-GaN contact layer of the mesa through the contact hole in the passivation layer.
7. A Gunn diode according to any one of paragraphs 1-6, wherein a longitudinal dimension L of the Gunn diode is a multiple of $\lambda/2n$.
8. A Gunn diode according to any one of paragraphs 1-7, wherein the slab waveguide has a width W that provides a single mode transmission of the terahertz wave during operation.
9. A Gunn diode according to any one of paragraphs 1-8, wherein the contact hole is located at L/2 where L is the distance between the first and second termination edges of the waveguide and W/2, where W is the distance between first and second lateral boundaries of the waveguide.
10. A Gunn diode according to any one of paragraphs 1-9, wherein the anode contact has a periodic pattern perpendicular to the longitudinal dimension with a periodicity of $\lambda/2n$.
11. A Gunn diode according to any one of paragraphs 1-10, wherein the GaN substrate has dislocation density less than $1\times10^6$ cm$^{-2}$.
12. A Gunn diode according to any one of paragraphs 1-11, wherein the GaN substrate is free of grain structure.
13. A Gunn diode according to any one of paragraphs 1-12, wherein the GaN substrate is made by an ammonothermal growth.
14. A Gunn diode according to any one of paragraphs 1-13, wherein the lateral direction of the waveguide is along an m-direction of the GaN substrate.
15. A Gunn diode according to any one of paragraphs 1-14, and further comprising a wave reflector adjacent to the second termination edge of the slab waveguide.
16. A Gunn diode according to paragraph 15, wherein the reflector is a Bragg reflector comprised of a set of plates adjacent to the second termination edge of the substrate, wherein the plates have an identical material composition to the materials of the Gunn diode at the second termination edge of the substrate and immediately adjacent to the set of plates, and the set of plates have air gaps between adjacent plates of the set of width $\lambda/4$.
17. A Gunn diode according to any paragraph above, wherein the cathode has an exposed surface that is planar across the entire surface.
18. A terahertz oscillator comprising a Gunn diode of any paragraph above and a conductive base in electrical and heat-conductive contact with the cathode.
19. A terahertz oscillator comprising a Gunn diode of any one of paragraphs 1-14 and a wave reflector comprised of one or more metal walls, with an air gap between a first of the metal walls and the second termination edge of the substrate of width $\lambda/4$.
20. A terahertz oscillator according to paragraph 19, wherein the one or more metal walls of the wave reflector are secured to a conductive base in electrical and heat-conductive contact with the cathode.
21. A terahertz oscillator according to any one of paragraphs 18-20, wherein a metal bond layer resides between the cathode and the conductive base and the GaN substrate has a sufficient thickness that a volume of the GaN substrate through which current flows acts as a vertical antenna in operation.
22. A terahertz oscillator according to paragraph 21, wherein the GaN substrate has a thickness T of $5/\lambda 4n$ or $9\lambda/4n$.

A Gunn diode may, of course, emit at a frequency that is not within the range of terahertz waves whereas a terahertz oscillator is configured to emit at a frequency within the range of terahertz waves.

Possible Modifications

Although the preferred embodiment uses Ti/Al/Ti/Au as cathode contact and Ti/In/Ti/Au as anode contact, other stack of metals such as Ti/Al/Ni/Au, Ti/Al/Pd/Au, Ti/Al/Pt/Au, Ti/Al/Mo/Au, Ti/Al/Re/Au, and Ti/Al/Ir/Au.

Although the preferred embodiment uses MOCVD as a growth method of GaN layers, other methods such molecular beam epitaxy (MBE) can be used.

Although the preferred embodiment grew GaN layers on the entire surface of the GaN substrate, these layers can be grown on a limited area of the GaN substrate.

Although the preferred embodiment uses ion-implantation to create a current-confinement structure, mesa-structure using etching of the n-GaN active layer, and n+-GaN contact layer can be used to create a current-confinement structure.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

All references discussed herein are incorporated by reference in their entirety as if put forth in full below and for all purposes (e.g. to satisfy any statutory requirements such as written description for any features and combination of features described in the references; to further explain points herein; to provide background information for additional understanding of the invention in context; and so forth).

Although the Example 1 showed a device with a contact hole of 10 micron in diameter, the size of the contact hole can be larger or smaller depending on the required power output and heat management design of the devices.

What is claimed is:

1. A terahertz oscillator to generate a terahertz wave of a wavelength $\lambda$ in air between 0.1 mm and 1 mm, comprising a Gunn diode comprising a GaN substrate having n-type conduction, an anode contact on a first major side of the GaN substrate, and the Gunn diode is configured to emit a terahertz wave formed on a second major side of the GaN substrate, wherein: the GaN substrate forms a slab waveguide having first and second lateral boundaries and having first and second termination edges, with the GaN substrate having a longitudinal dimension of L in a longitudinal direction, lateral dimension of W, and thickness of T; the Gunn diode emits the terahertz wave in the slab waveguide; and the slab waveguide is configured to conduct the terahertz wave along the longitudinal direction, and to emit the terahertz wave at first and second termination edges of the slab waveguide during operation, wherein the Gunn diode further comprises a contact layer of n+-GaN on a top of the active layer, a passivation layer with a contact hole on the contact layer, and a portion of the metal cathode contact in the contact hole, wherein the cross-sectional area of the contact hole is smaller than 0.01 mm².

2. A terahertz oscillator according to claim 1, wherein the Gunn diode comprises an active layer of a n-type GaN having an electron saturation velocity of Vsat, and the thickness t of the active layer is provided by the equation t=$\lambda$Vsat/c, wherein c is the speed of light.

3. A terahertz oscillator according to claim 1, wherein the active layer and the contact layer under the passivation layer outside of the contact hole is insulating due to ion implantation.

4. A terahertz oscillator according to claim 3, wherein the ion implantation comprises nitrogen, magnesium, carbon, iron, or manganese implantation.

5. A terahertz oscillator according to claim 1, wherein the longitudinal dimension L is a multiple of $\lambda/2n$, wherein n is the refractive index of the GaN substrate at 2.

6. A terahertz oscillator according to claim 1, wherein the metal cathode contact is mounted on a conductive base with a metal bond and the thickness of the GaN substrate is such that a volume of the GaN substrate through which electric current flows acts as a vertical antenna during use.

7. A terahertz oscillator according to claim 6, wherein the thickness of the GaN substrate T is $5\lambda/4n$ or $9\lambda/4n$.

8. A terahertz oscillator according to claim 1, wherein the lateral dimension W of the waveguide provides a single mode transmission of the terahertz wave during operation.

9. A terahertz oscillator according to claim 1, wherein the contact hole is located at L/2 from the first and second termination edges and W/2 from the first and second lateral boundaries of the waveguide.

10. A terahertz oscillator according to claim 1, wherein the GaN substrate has air grooves adjacent to one of the termination edges, thereby forming a Bragg-reflector at the first or the second termination edge of the waveguide.

11. A terahertz oscillator according to claim 1, wherein the anode contact has a periodic pattern perpendicular to the longitudinal dimension with a periodicity of $\lambda/2n$.

12. A terahertz oscillator according to claim 1, wherein the GaN substrate has a dislocation density less than $1 \times 10^6$ cm$^{-2}$.

13. A terahertz oscillator according to claim 1, wherein the GaN substrate is free of grain structure.

14. A terahertz oscillator according to claim 1, wherein the GaN substrate is made by an ammonothermal growth.

15. A terahertz oscillator according to claim 1, wherein the lateral direction of the waveguide is along an m-direction of the GaN substrate.

16. A terahertz oscillator according to claim 1, wherein the cathode has an exposed surface that is planar across the entire surface.

17. A terahertz oscillator to generate a terahertz wave of a wavelength $\lambda$ in air between 0.1 mm and 1 mm, comprising a Gunn diode comprising a GaN substrate having n-type conduction, an anode contact on a first major side of the GaN substrate, and the Gunn diode is configured to emit a terahertz wave formed on a second major side of the GaN substrate, wherein: the GaN substrate forms a slab waveguide having first and second lateral boundaries and having first and second termination edges, with the GaN substrate having a longitudinal dimension of L in a longitudinal direction, lateral dimension of W, and thickness of T; the Gunn diode emits the terahertz wave in the slab waveguide; and the slab waveguide is configured to conduct the terahertz wave along the longitudinal direction, and to emit the terahertz wave at first and second termination edges of the slab waveguide during operation, wherein the Gunn diode further comprises a contact layer of n+-GaN on a top of the active layer, and the active layer and the contact layer have a mesa shape formed by etching the active layer and the contact layer, and further comprising a passivation layer covering the exposed surface except for the top surface of the contact layer and having a contact hole through the passivation layer, and a portion of the metal cathode extending through the contact hole and in contact with the n+-contact layer, wherein the cross-sectional area of the contact hole is smaller than 0.01 mm².

18. A terahertz oscillator to generate a terahertz wave of a wavelength $\lambda$ in air between 0.1 mm and 1 mm, comprising a Gunn diode comprising a GaN substrate having n-type conduction, an anode contact on a first major side of the GaN substrate, and the Gunn diode is configured to emit a terahertz wave formed on a second major side of the GaN substrate, wherein: the GaN substrate forms a slab waveguide having first and second lateral boundaries and having first and second termination edges, with the GaN substrate having a longitudinal dimension of L in a longitudinal direction, lateral dimension of W, and thickness of T; the Gunn diode emits the terahertz wave in the slab waveguide;

and the slab waveguide is configured to conduct the terahertz wave along the longitudinal direction, and to emit the terahertz wave at first and second termination edges of the slab waveguide during operation, wherein the metal cathode contact is mounted on a conductive base with a metal bond and the thickness of the GaN substrate is such that a volume of the GaN substrate through which electric current flows acts as a vertical antenna during use, and wherein the conductive base further comprises a wave reflector adjacent to one side of the first termination edge.

19. A terahertz oscillator according to claim 18, wherein the wave reflector comprises at least one metal wall defining an air gap having a width of $\lambda/4$.

* * * * *